United States Patent
Pant et al.

[19]

[11] Patent Number: 5,982,178
[45] Date of Patent: Nov. 9, 1999

[54] METHOD AND APPARATUS FOR SENSING A DESIRED COMPONENT OF AN INCIDENT MAGNETIC FIELD USING MAGNETO RESISTIVE ELEMENTS BIASED IN DIFFERENT DIRECTIONS

[75] Inventors: Bharat B. Pant, Minneapolis; Hong Wan, Maple Grove, both of Minn.

[73] Assignee: Honeywell Inc., Minneapolis, Minn.

[21] Appl. No.: 08/993,215

[22] Filed: Dec. 18, 1997

[51] Int. Cl.⁶ .................................................. G01R 33/02
[52] U.S. Cl. ......................................... 324/252; 338/32 R
[58] Field of Search ......................... 324/252; 338/32 R; 360/113

[56] References Cited

U.S. PATENT DOCUMENTS

| | | | |
|---|---|---|---|
| 5,251,170 | 10/1993 | Daughton et al. | 365/158 |
| 5,420,819 | 5/1995 | Pohm | 365/158 |
| 5,424,236 | 6/1995 | Daughton et al. | 437/52 |
| 5,569,544 | 10/1996 | Daughton | 428/611 |
| 5,595,830 | 1/1997 | Daughton | 428/611 |
| 5,617,071 | 4/1997 | Daughton | 338/32 |
| 5,636,159 | 6/1997 | Pohm | 365/158 |

OTHER PUBLICATIONS

Helmolt et al., Intrinsic giant magnetoresistance of mixed valence La–A–Mn oxide (A=Ca,Sr,Ba)(invited), *J. Appl. Physics*, Nov. 15, 1994, 4 pages.

Jin et al., "Thousandfold Change in Resistivity in Magnetoresistive La–Ca–Mn–O Films", *Science*, vol. 264, 413, Apr. 1994, 3 pages.

Fontcuberta et al., "Chemical tuning of the colossal magnetoresistance of ferromagnetic perovskites", *Euophys. Lett*, 34 (5), 6 pages.

Laffez et al, "Structural Phase Transition at Low Temperature, Corresponding to Charge Ordering in the CMR . . .", *Materials Research Bulletin*, vol. 31, No. 8, 1996, 7 pages.

*Primary Examiner*—Walter E. Snow
*Attorney, Agent, or Firm*—Gregory A. Bruns

[57] ABSTRACT

A method and apparatus for sensing a desired component of a magnetic field using an isotropic magnetoresistive material. This is preferably accomplished by providing a bias field that is parallel to the desired component of the applied magnetic field. The bias field is applied in a first direction relative to a first set of magnetoresistive sensor elements, and in an opposite direction relative to a second set of magnetoresistive sensor elements. In this configuration, the desired component of the incident magnetic field adds to the bias field incident on the first set of magnetoresistive sensor elements, and subtracts from the bias field incident on the second set of magnetoresistive sensor elements. The magnetic field sensor may then sense the desired component of the incident magnetic field by simply sensing the difference in resistance of the first set of magnetoresistive sensor elements and the second set of magnetoresistive sensor elements.

46 Claims, 7 Drawing Sheets

METHOD AND APPARATUS FOR SENSING A DESIRED COMPONENT OF AN INCIDENT MAGNETIC FIELD USING MAGNETO RESISTIVE ELEMENTS BIASED IN DIFFERENT DIRECTIONS

This invention was made with Government support under NASA contract NAS3-27809 entitled "Giant Magnetoresistive Oxide Sensors". The Government has certain rights in the invention.

BACKGROUND OF THE INVENTION

1. Field of the Invention

The present invention generally relates to magnetic field sensor devices and more particularly relates to such devices that measure a selected component of an incident magnetic field.

2. Description of the Prior Art

Magnetometers and other magnetic sensing devices have many diverse applications including automobile detection, proximity sensors, magnetic disk memories, magnetic tape storage systems, magnetic strip readers, etc. Such devices typically provide one or more output signals that represent the magnetic field sensed by the magnetic sensing device.

Magnetic sensor devices typically include one or more sensor element that is formed from a magnetoresistive material. The resistance of a magnetoresistive material typically changes when exposed to an incident magnetic field. Thus, to detect an incident magnetic field, most magnetic sensor devices simply sense the change in the resistance of the magnetoresistive material, and provide an output signal that indicates the presence of, or has an amplitude that is a function of, the incident magnetic field.

Common magnetoresistive materials include Anisotropic Magnetoresistive (AMR) materials, Giant Magnetoresistive (GMR) materials, and Colossal Magnetoresistive (CMR) materials. The resistance of AMR materials typically only changes a few percent change when exposed to an incident magnetic field. AMR materials are typically anisotropic with respect to the supplied current direction and incident field direction. Under limited conditions, however, AMR materials can be isotropic with respect to the incident field direction.

The resistance of GMR materials can change several hundred percent when exposed to an incident field. GMR materials are typically formed using multilayer films to produce a giant magnetoresistive effect. GMR materials are typically isotropic with respect to current direction, but can be anisotropic or isotropic with respect to the incident field direction depending on the type of crystal and shape structure. AMR and GMR materials are further discussed in U.S. Pat. No. 5,569,544 to Daughton.

CMR materials have the greatest magnetoresistive effect in response to an incident magnetic field. The resistance of a CMR material can change up to a $10^6$ percent. Most CMR materials are intrinsically isotropic in nature with respect to the supplied current and the incident magnetic field direction.

The response curve for a magnetoresistive material is often defined with the amplitude of the incident magnetic field along the X-axis, and the resulting resistance of the magnetoresistive material along the Y-axis. CMR and some GMR magnetoresistive materials often have both a symmetrical and isotropic response curve. A symmetrical response curve is one that is symmetrical about the Y-Axis. That is, the magnetoresistive material satisfies the equation $R(H)=R(-H)$, where H is the incident magnetic field.

For CMR and some GMR magnetoresistive materials, the response curve is not perfectly symmetrical because of a hysteresis effects. FIG. 1 shows a response curve for a typical CMR magnetoresistive material. The response curve is nearly symmetrical ($R(H) \approx R(-H)$) about H=0, with some hysteresis shown. For CMR and some GMR magnetoresistive materials, the hysteresis effects are small and can be effectively ignored except in the most sensitive magnetic sensor applications. As indicated above, CMR and some GMR magnetoresistive materials also have an isotropic response curve. An isotropic response curve is one that is independent of the direction of the incident magnetic field, usually within a sensor plane.

FIG. 2 shows a schematic of a typical resistance measurement of a magnetoresistive film 20. Only a portion of the magnetoresistive film 20 is shown. Input current terminals 22 and 24 are electrically connected to the magnetoresistive field 20, as shown. A current source 26 is then connected between input current terminals 22 and 24 to provide a current through the magnetoresistive film 20. Output voltage terminals 28 and 30 are also electrically connected to the magnetoresistive field 20, as shown. A volt meter 32 measures the voltage generated between the output voltage terminals 28 and 30. The voltage measured by volt meter 32 is proportional to the resistance of the magnetoresistive film 20.

To measure the response curve of a magnetoresistive material, an incident magnetic field H 38 is provided to the film 20 at an angle θ 34 relative to a reference direction 36 in the sensor plane. As indicated above, CMR and some GMR magnetoresistive materials are typically isotropic, exhibiting the same response curve regardless of the direction θ 34 of the incident magnetic field in the sensor plane.

For many applications, it is desirable to sense only one component of an incident magnetic field. AMR materials provide this function intrinsically. However, and as indicated above, AMR materials are have a much smaller magneto-resistive effect than materials such as CMR materials and some GMR materials. CMR and some GMR materials, while having a higher magneto-resistive effect, typically exhibit the same response curve regardless of the direction of the incident magnetic field in the sensor plane. Thus, it would be desirable to provide a magnetic field sensor that uses an isotropic material with a higher magneto-resistive effect, but anisotropic in that only a desired component of the incident magnetic field is sensed thereby.

SUMMARY OF THE INVENTION

The present invention overcomes many of the disadvantages of the prior art by providing a magnetic field sensor that uses an isotropic material, but senses only a desired component of the incident magnetic field. This is preferably accomplished by providing a bias field that is parallel to the desired component of the applied magnetic field. The bias field is applied in a first direction relative to a first set of magnetoresistive sensor elements, and in an opposite direction relative to a second set of magnetoresistive sensor elements. In this configuration, the desired component of the incident magnetic field adds to the bias field incident on the first set of magnetoresistive sensor elements, and subtracts from the bias field incident on the second set of magnetoresistive sensor elements. The magnetic field sensor may then sense the desired component of the incident magnetic field by simply sensing the difference in resistance of the first set of magnetoresistive sensor elements and the second set of magnetoresistive sensor elements.

In a first illustrative embodiment, the magnetic field sensor includes a bias field generator means for generating a bias field that is parallel to the desired component of the incident magnetic field. Also provided are a first leg incorporating an isotropic magnetoresistive material that connects an output net to a first power supply, and a second leg incorporating an isotropic magnetoresistive material that connects the output net to a second power supply. Thus, the first leg and the second leg are in a voltage divider configuration.

The first leg is preferably oriented in a first direction relative to the bias field, and the second leg is preferably oriented in a second direction relative to the bias field. Although not necessary, the first and second legs are preferably substantially identical in size and shape, and thus provide the same resistance when an identical magnetic field is applied thereto.

Absent a bias field, each component of an incident magnetic field changes the resistance of the first and second legs equally, regardless of the direction of the incident magnetic field. Accordingly, the output net remains at a relatively fixed value. When the bias field is applied, the component of the incident magnetic field adds to the bias field in the first leg, and subtracts from the bias field in the second leg. Thus, and referring to FIG. 1, a first change in resistance is produced in the first leg and a second change in resistance is produced in the second leg. This produces a voltage change at the output net.

The amplitude of the voltage change at the output net is a function of the amplitude of the desired component of the incident magnetic field. The direction of the voltage change at the output net indicates the direction of the desired component of the magnetic field relative to the bias field. It is contemplated that the bias field may be a DC bias field or an AC bias field.

In another illustrative embodiment, the magnetic field sensor includes a bias field generator means for generating a bias field that is parallel to the desired component of the applied magnetic field. The magnetic field sensor also includes a first, a second, a third and a fourth leg. The first and second legs are preferably connected between a first output net and a second output net, respectively, and a first power supply. The third and fourth legs are preferably connected between the first output net and the second output net, respectively, and a second power supply. The first, second, third and fourth legs preferably incorporate an isotropic magnetoresistive material to produce an isotropic change in the resistance in the corresponding leg in response to a magnetic field.

The first leg and the fourth leg are preferable oriented in a first direction relative to the bias field, and the second and third legs are preferably oriented in a second direction relative to the bias field. Although not necessary, the first, second, third and fourth legs are preferably substantially identical in size and shape.

Absent a bias field, each component of an incident magnetic field changes the resistance of the first, second, third and fourth legs equally, regardless of the direction of the incident magnetic field. Thus, the first output net and the second output net remain at a relatively fixed value. When the bias field is applied, the component of the incident magnetic field adds to the bias field at the first leg and fourth legs, and subtracts from the bias field at the second and third legs. Thus, and referring to FIG. 1, a first change in resistance is produced in the first and fourth legs and a second change in resistance is produced in the second and third legs. This produces a first voltage change at the first output net and an opposite voltage change at the second output net.

Accordingly, the difference in voltage between the first output net and the second output net changes, and the amplitude of the change is a function of the amplitude of the desired component of the incident magnetic field. In this embodiment, the change in voltage between the first output net and the second output net may be twice that of the embodiment of FIG. 3.

It is contemplated that the bias field may be a DC bias field or an AC bias field. When a DC bias field is applied, the direction of the voltage change between the first output net and the second output net indicates the direction of the desired component of the magnetic field. When an AC bias field is applied, the phase of the voltage change between the first output net and the second output net indicates the direction of the desired component of the magnetic field.

In accordance with the above, a method for sensing a desired component of an incident magnetic field is contemplated. The illustrative method comprises the steps of: providing a bias field that is parallel to the desired component of the applied magnetic field, wherein the bias field is applied in a first direction relative to a first set of the two or more magnetoresistive sensor elements and in a second direction relative to a second set of the two or more magnetoresistive sensor elements; and receiving the incident magnetic field, wherein the desired component of the incident magnetic field adds to the bias field incident on the first set of magnetoresistive sensor elements, and subtracts from the bias field incident on the second set of magnetoresistive sensor elements. The terms "add" and "subtract" are used herein in the vector sense, particularly when an AC bias field is applied. The sensor device then senses the desired component of the incident magnetic field by sensing a difference in resistance caused by the difference in the magnetic fields that are incident on the first set of magnetoresistive sensor elements and the second set of magnetoresistive sensor elements.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
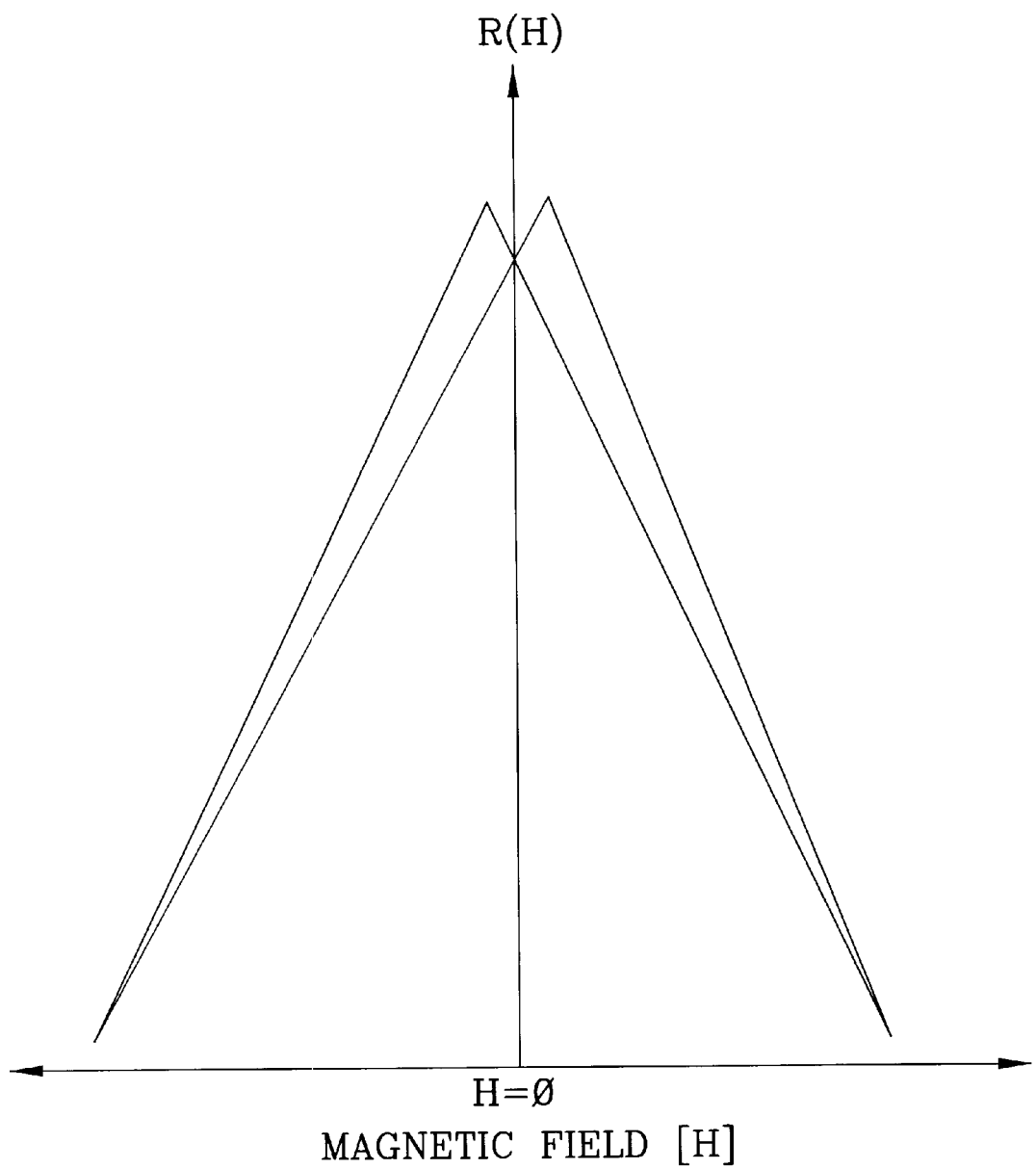
FIG. 1 is a response curve for a typical magnetoresistive material.
Figure 2:
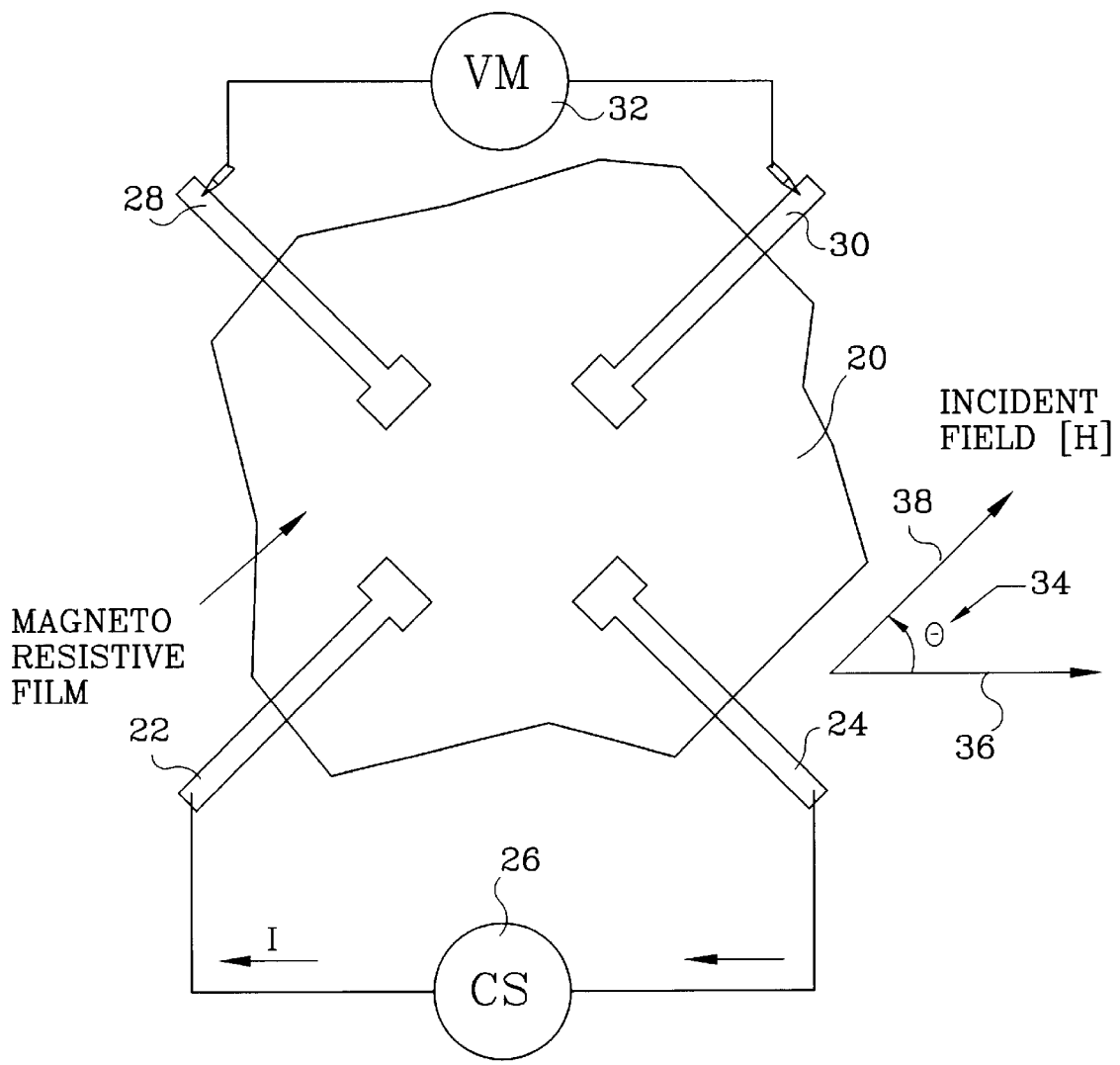
FIG. 2 shows a schematic diagram of a typical resistance measurement of a magnetoresistive film.
Figure 3:
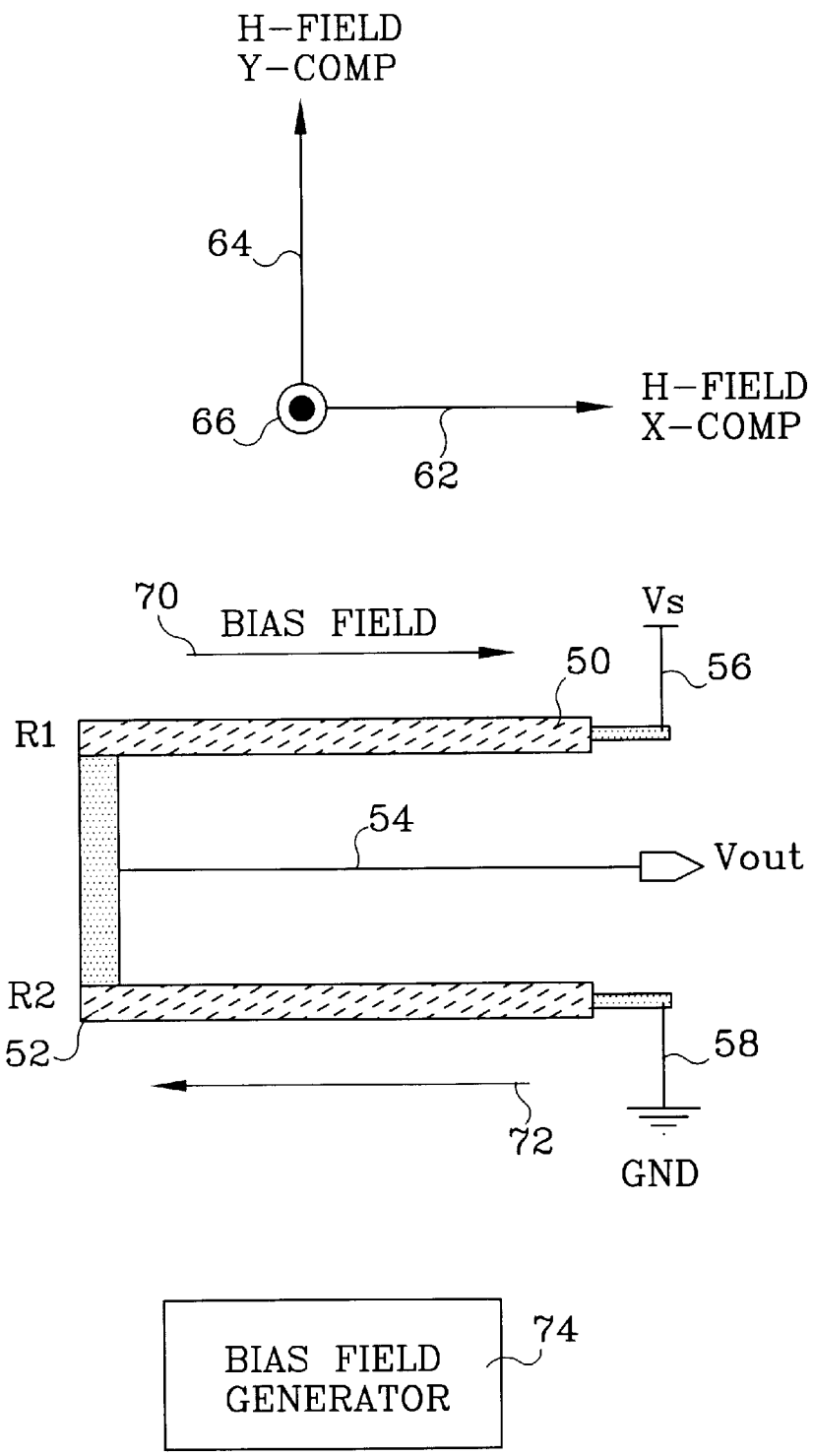
FIG. 3 is a schematic diagram of a first illustrative embodiment of the present invention.

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein:

FIG. 3 is a schematic diagram of a first illustrative embodiment of the present invention. In this embodiment, the magnetic field sensor includes a first leg 50 and a second leg 52. The first leg 50 is connected between an output net $V_{out}$ 54 and a first power supply terminal 56. The second leg 52 is connected between the output net $V_{out}$ 54 and a second power supply terminal 58. The first power supply terminal 56 is preferably connected to a first power supply voltage (Vs), and the second power supply terminal 58 is preferably connected to ground (GND).

The first leg preferably has a first resistance R1, and the second leg preferably has a second resistance R2. In this configuration, the output voltage at the output net $V_{out}$ 54 is given by the expression:

$$V_{out} = V_s \left[ \frac{R2}{R1 + R2} \right] \quad (1)$$

To sense an incident magnetic field, the first leg 50 and the second leg 52 each preferably incorporate an isotropic magnetoresistive material. Further, the first leg 50 and the second leg 52 are preferably substantially identical in size and shape. Because an isotropic magnetoresistive material is used, the first leg 50 and the second leg 52 provide the same resistance in response to an incident magnetic field, regardless of the direction of the incident magnetic field. Therefore, without a bias field applied, the above expression for $V_{out}$ reduces to;

$$V_{out} = \frac{V_s}{2} \quad (2)$$

Thus, the output net $V_{out}$ 54 remains relatively constant when an incident magnetic field is applied to the magnetic field sensor.

The incident magnetic field may have an x-component 62, a y-component 64 and/or a z-component 66. Preferably, the isotropic magnetoresistive material incorporated into the first leg 52 and the second leg 54 is applied as a film. In this configuration, the z-component 66 of the incident magnetic field may not produce a significant change in the resistance of the magnetoresistive material because of relatively large demagnetizing fields along the thickness of the film.

To sense only one component of the incident magnetic field, the present invention contemplates providing a bias field that is parallel to the desired component of the incident magnetic field. This may be accomplished using a bias field generator 74. The bias field generator may be an external coil, an electromagnet, an integrated on-chip coil, or any other means for generating a bias field.

In the embodiment shown, the bias field is applied parallel to the x-component 62 of the incident magnetic field. The bias field is preferably applied in a first direction 70 relative to the first leg 50, and in an opposite direction 72 relative to the second leg 52. Accordingly, the x-component 62 of the incident magnetic field adds to the bias field incident on the first leg 50, and subtracts from the bias field incident on the second leg 52. The magnetic field sensor may then senses the x-component 62 of the incident magnetic field by simply sensing the difference in resistance of the first leg 50 and the second leg 52 by examining the voltage at the output net $V_{out}$ 54.

Absent a bias field, both the x-component 62 and the y-component 64 of the incident magnetic field change the resistance of the first leg 50 and second leg 52 equally, as described above. However, when the bias field is applied in parallel with the x-component of the incident magnetic field, an imbalance is created. The bias field adds to the x-component of the incident magnetic field to produce a first change in resistance in the first leg 50. Likewise, the bias field subtracts from the x-component of the incident magnetic field to produce a second change in resistance in the second leg 52.

Accordingly, the voltage at the output net $V_{out}$ 54 changes. The amplitude of the voltage change at the output net $V_{out}$ 54 may be a function of the amplitude of the desired component of the incident magnetic field. The direction of the voltage change may indicate the direction of the desired component of the incident magnetic field relative to the applied bias field.

Figure 4:
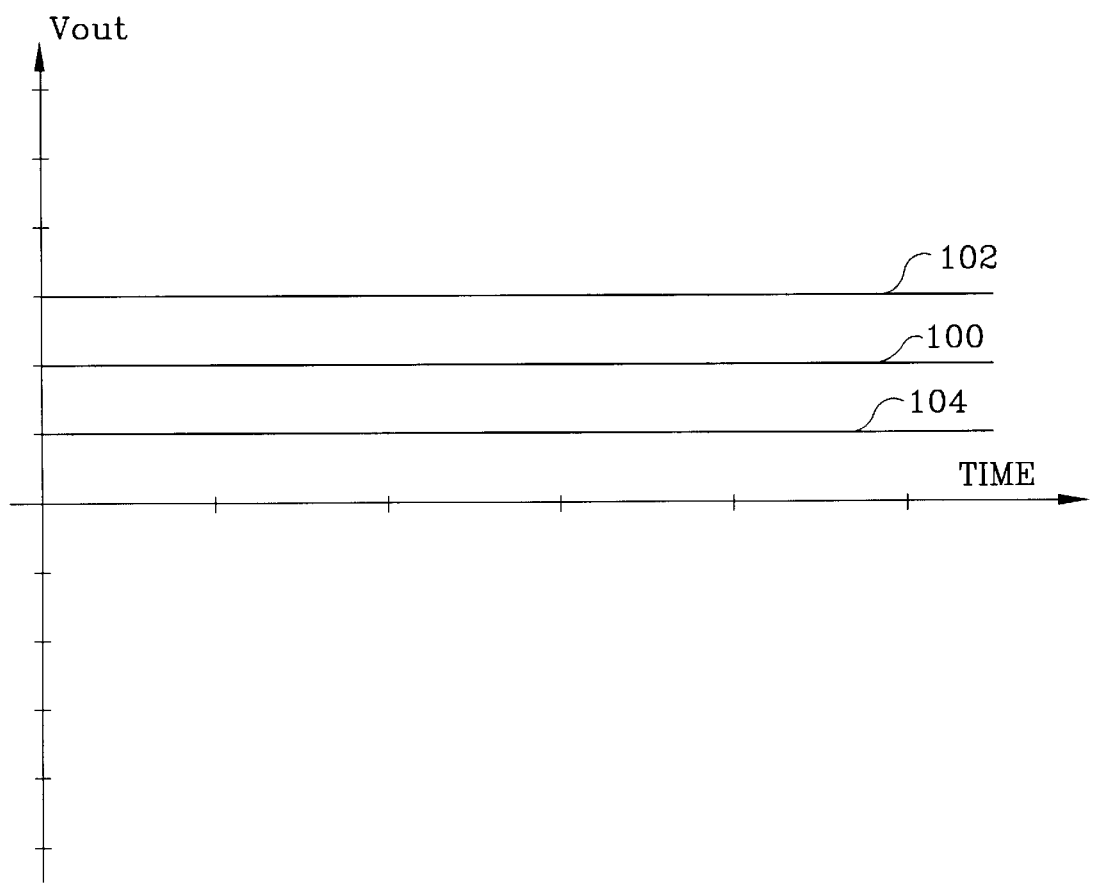
FIG. 4 is a diagram showing $V_{out}$ versus time for the embodiment of FIG. 3 with a DC bias field applied.

It is contemplated that the bias field may be a DC bias field or an AC bias field. FIG. 4 is a diagram showing the voltage $V_{out}$ versus time, with a DC bias field applied. Line 100 represents the voltage of $V_{out}$ with only the bias field applied. Even though the bias field is applied to the first leg 50 in an opposite direction to the second leg 52, both the first leg 50 and the second leg 52 produce the same change in resistance. This is because the magnetoresistive material incorporated into the first leg 50 and the second leg 52 is preferably isotropic. Thus, the output net $V_{out}$ 54 remains at a relatively fixed value, as shown.

Line 100 also represents the voltage of $V_{out}$ with an incident magnetic field is present, absent a bias field. As indicated above, both the x-component 62 and the y-component 64 of the incident magnetic field change the resistance of the first leg 50 and second leg 52 equally, regardless of the direction of the incident magnetic field. Accordingly, the output net $V_{out}$ 54 remains at a relatively fixed value, as shown.

Line 102 shows the value of $V_{out}$ with a bias field applied in a first direction parallel to the x-component of an incident magnetic field. When the bias field is applied in the manner, the x-component of the incident magnetic field produces a first change in resistance in the first leg 50 and a second change in resistance in the second leg 52. Thus, the voltage at the output net $V_{out}$ 54 changes in first direction, as shown. The amplitude of the change is a function of the amplitude of the x-component of the incident magnetic field.

Line 104 shows the value of $V_{out}$ with a bias field applied in a second direction parallel to the x-component of the incident magnetic field. Under this scenario, the x-component of the incident magnetic field produces the first change in resistance in the second leg 52 and the second change in resistance in the first leg 50. Accordingly, the voltage at the output net $V_{out}$ 54 changes in a second direction, as shown. Again, the amplitude of the change is a function of the amplitude of the x-component of the incident magnetic field. As can be seen from lines 102 and 104 of FIG. 4, the direction of the voltage change of $V_{out}$ indicates the direction of the desired component of the magnetic field relative to the direction of the bias field.

Figure 5:
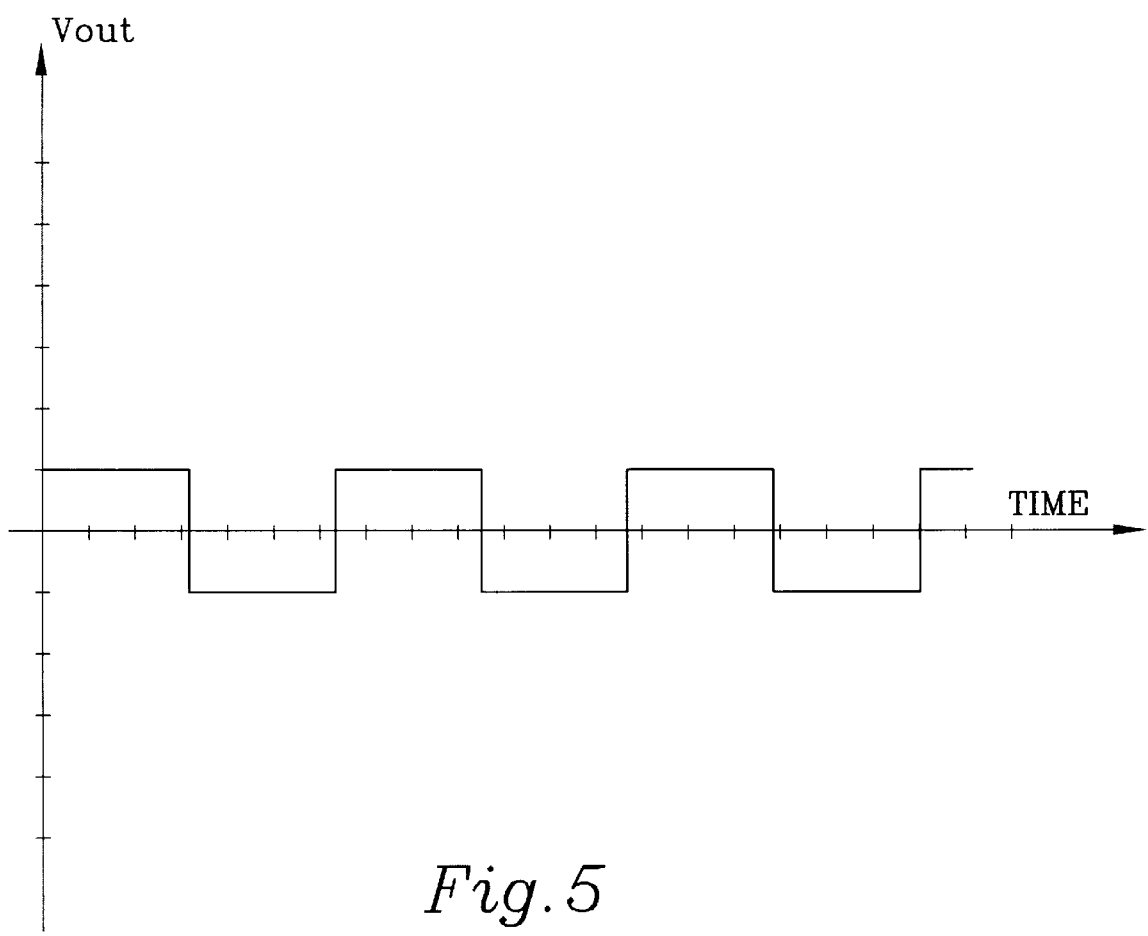
FIG. 5 is a diagram showing $V_{out}$ versus time for the embodiments of FIG. 3 and FIG. 7 with a square wave AC bias field applied.

FIG. 5 is a diagram showing the value of $V_{out}$ versus time when a square wave AC bias field is applied to the embodiment shown in FIG. 3. In this embodiment, the imbalance in resistance between the first leg 50 and the second leg 52 is time dependent. The result is a square wave output, with the amplitude of the square wave being a function of the amplitude of the x-component of the incident magnetic field. The phase of the square wave output indicates the direction of the incident magnetic field relative to the bias field.

Figure 6:
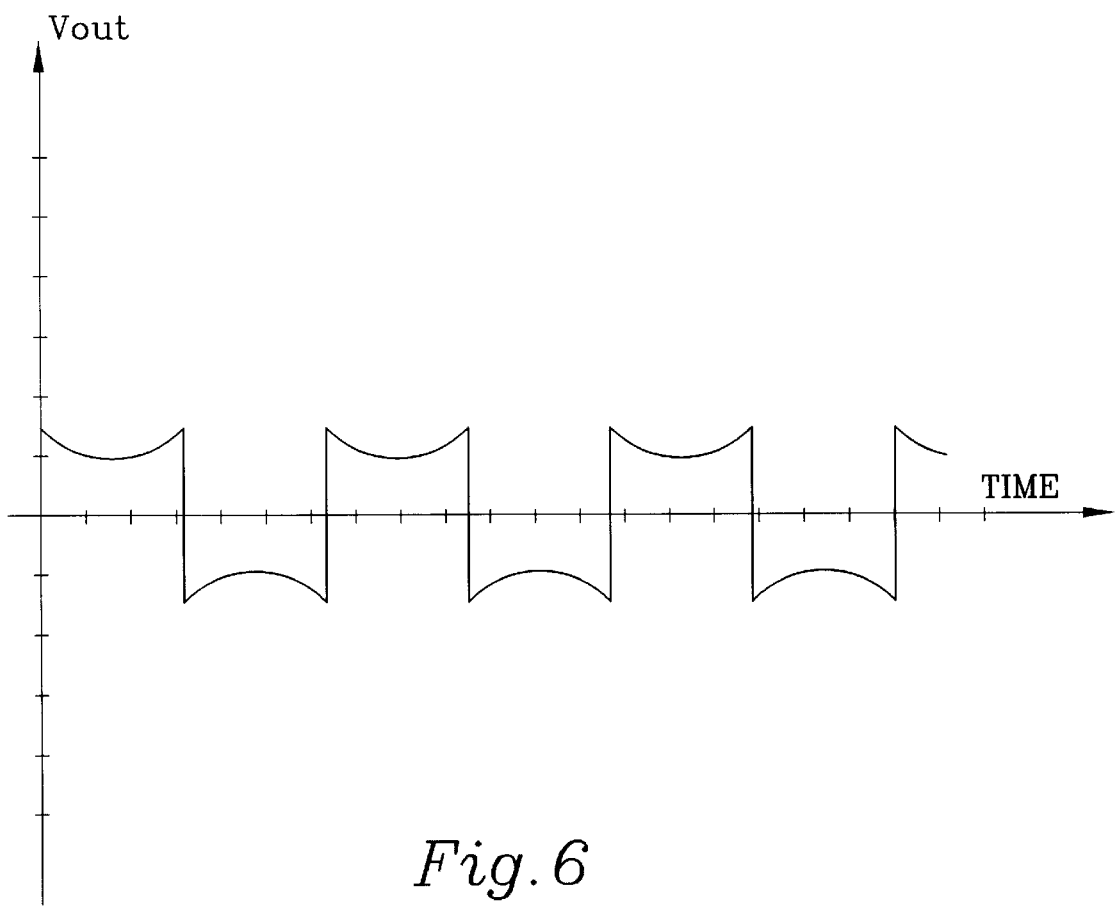
FIG. 6 is a diagram showing $V_{out}$ versus time for the embodiments of FIG. 3 and FIG. 7 with a sine wave AC bias field applied.

FIG. 6 is a diagram showing the value of $V_{out}$ versus time when a sine wave AC bias field is applied to the embodiment shown in FIG. 3. In this embodiment, the imbalance in resistance between the first leg 50 and the second leg 52 is also time dependent. The result is a modified square wave output, with the amplitude of the modified square wave output being a function of the amplitude of the x-component of the incident magnetic field. The phase of the modified square wave output indicates the direction of the incident magnetic field relative to the bias field.

To maximize the output signal of the magnetic sensor device, the first leg 50 and the second leg 52 preferably incorporate a Colossal magnetoresistive (CMR) material. Colossal magnetoresistive materials are known to have an isotropic and symmetrical response curve. Other isotropic magnetoresistive materials may also be used, including certain isotropic GMR materials.

Illustrative Colossal magnetoresistive materials are those generally described by the formula $(LnA)MnO_3$, wherein Ln=La, Nd, or Pr and A=Ca, Sr, Ba or Pb. Preferably, the Colossal magnetoresistive material is LaCaMnO, having concentrations of La between 26–32 at %, Ca between 9–20 at %, and Mn between 47–64 at %. More preferably, the Colossal magnetoresistive material is LaCaMnO, having a 28.4 at % concentration of La, a 11.6 at % concentration of Ca, and a 60 at % concentration of Mn.

Figure 7:
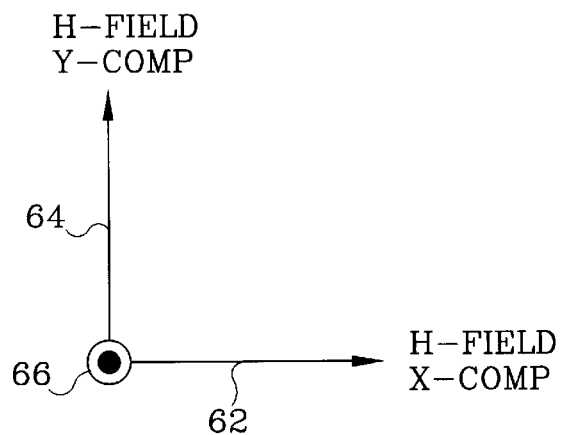
FIG. 7 is a schematic diagram of a second illustrative embodiment of the present invention.
Figure 7:
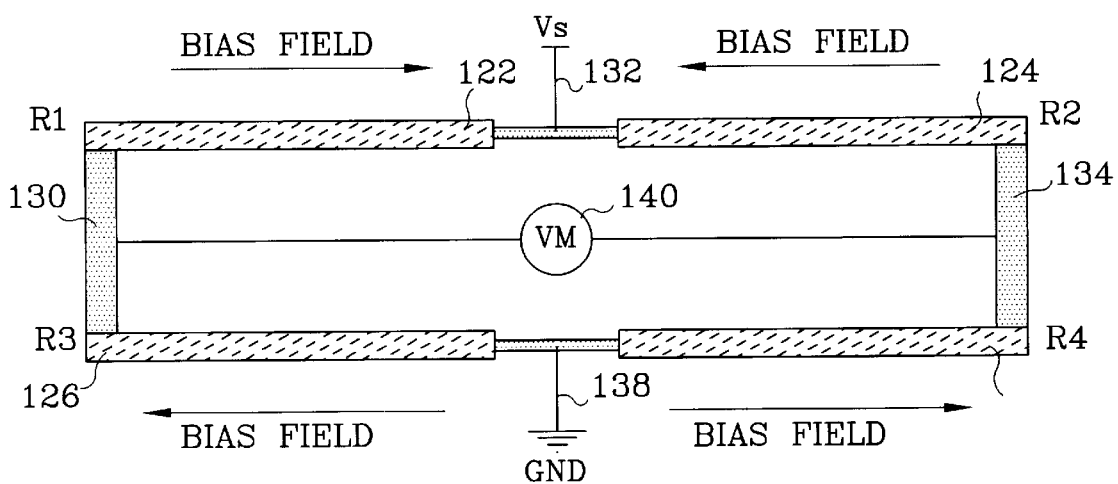
Figure 7:
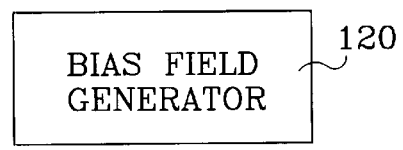

FIG. 7 is a schematic diagram of a second illustrative embodiment of the present invention. This embodiment includes a first leg 122, a second leg 124, a third leg 126 and a fourth leg 128. The first leg 122 connects a first output net 130 to a first power supply 132. The second leg 124 connects a second output net 134 to the first power supply 132. The third leg 126 connects the first output net 130 to a second power supply 138. The fourth leg 128 connects the second output net 134 to the second power supply 138.

The first, second, third and fourth legs preferably incorporate an isotropic magnetoresistive material to produce an isotropic change in the resistance in the corresponding leg in response to a magnetic field. The first leg 122 and the fourth leg 128 are preferable oriented in a first direction relative to the bias field, and the second leg 124 and the third leg 126 are preferably oriented in a second direction relative to the bias field. The first leg 122, second leg 124, third leg 126 and fourth leg 128 are preferably substantially identical in size and shape.

To maximize the output signal of the magnetic sensor device, the first leg 122, second leg 124, third leg 126, and fourth leg 128 each preferably incorporate a Colossal magnetoresistive material. Colossal magnetoresistive materials are known to have an isotropic and symmetrical response curve. As indicated above, however, other isotropic materials may also be used, including certain isotropic GMR materials.

Absent a bias field, each component of an incident magnetic field changes the resistance of the first leg 122, second leg 124, third leg 126 and fourth leg 128 equally, regardless of the direction of the incident magnetic field. Accordingly, the first output net 130 and the second output net 134 remain at a relatively fixed value. When the bias field is applied, however, the component of the incident magnetic field that is parallel to the bias field adds to the bias field at the first leg 122 and the fourth leg 128 to produce a first change in resistance in the first leg 122 and the fourth leg 128. Likewise, the component of the incident magnetic field that is parallel to the bias field subtracts from the bias field at the second leg 124 and the third leg 126 to produce a second change in resistance in the second leg 124 and the third leg 126. Accordingly, the difference in voltage between the first output net 130 and the second output net 134 changes, and the amplitude of the voltage change is a function of the amplitude of the desired component of the incident magnetic field.

It is contemplated that the bias field may be a DC bias field or an AC bias field. When a DC bias field is applied, the direction of the change in voltage between the first output net 130 and the second output net 134 indicates the direction of the desired component of the magnetic field. When an AC bias field is applied, the phase of the voltage change between the first output net 130 and the second output net 134 indicates the direction of the desired component of the magnetic field relative to the bias field.

In accordance with the above, a method for sensing a desired component of an incident magnetic field is contemplated. The illustrative method comprises the steps of: providing a bias field that is parallel to the desired component of the applied magnetic field, wherein the bias field is applied in a first direction relative to a first set of the two or more magnetoresistive sensor elements and in a second direction relative to a second set of the two or more magnetoresistive sensor elements; and receiving the incident magnetic field, wherein the desired component of the incident magnetic field adds to the bias field incident on the first set of magnetoresistive sensor elements, and subtracts from the bias field incident on the second set of magnetoresistive sensor elements. The terms "add" and "subtract" are used herein are used in the vector sense, particularly when an AC bias field is applied. The sensor device then senses the desired component of the incident magnetic field by sensing a difference in resistance caused by the difference in the magnetic fields that are incident on the first set of magnetoresistive sensor elements and the second set of magnetoresistive sensor elements.

Sine wave AC bias field Example

In this example, the bias field is given by the expression $H_b(t)=H_0 \sin(\omega t)$ and $|H_0|>>|H|$, where H is the incident magnetic field to be measured. $H=H_x i+H_y j$, where i and j are unit vectors along the x and y axes. Resistance in each leg is then given by the equation $R=R_0+R1(H_t)$, where $H_t$ is the total field, $R_0$ is the resistance at zero field, and R1 is the incremental resistance in response to the magnetic field. For this illustration, each of the four legs 122, 124, 126 and 128 has the same zero field resistance $R_0$.

Ignoring hysteresis, a model for the incremental resistance $R1(H_t)$ is well approximated by:

$$R1(H_t)=(\Delta R/R)_{max} \cdot |H_t|/H_{sat}=C \cdot |H_t| \qquad (3)$$

where $H_{sat}$ is the maximum field in the linear range, and $(\Delta R/R)_{max}$ is the magnetoresistance ratio at maximum field. Leg 122 and leg 128 have the same resistance to each other, and leg 124 and leg 126 have the same resistance to each other. $H_z$ is negligible due to the large demagnetizing field out of the film plane, as described above. Thus, $$R_{1,4}=R_0+C \cdot sqrt\{[H_x+H_0 \sin(\omega t)]^2+H_y^2\} \qquad (4)$$

$$R_{2,3}=R_0+C \cdot sqrt\{[H_x-H_0\sin(\omega t)]^2+H_y^2\} \quad (5)$$

With a constant voltage excitation, the output of the bridge is given by the equation:

$$V_{out} = V_s \cdot \frac{(R_{1,4} - R_{2,3})}{(R_{1,4} + R_{2,3})} \quad (6)$$

After inserting the values for $R_{1,4}$ and $R_{2,3}$ from equations 4 and 5 above, this equation yields to linear order in fields:

$$V_{out} = V_s \cdot C \cdot H_x \frac{|Sin(\omega t)|}{Sin(\omega t)} \cdot \frac{1}{(R_0 + C \cdot H_0|Sin(\omega t)|)} \quad (7)$$

Thus, to linear order in fields, $V_{out}$ is a function of $H_x$, and is independent of $H_y$. This demonstrates the sensitivity to only one component of the incident magnetic field. The resulting output voltage of $V_{out}$ is generally represented by the modified square wave shown in FIG. 6. The amplitude of the modified square wave is a function of the amplitude of the desired component of the incident magnetic field. Further, the phase of the modified square wave indicates the direction of the desired component of the magnetic field relative to the applied bias field.

With a constant current excitation, the output voltage is much simpler, and given by the equation:

$$V_{out}=I_B \cdot (R_{1,4}-R_{2,3})=I_B \cdot C \cdot H_x \cdot 2|\sin(\omega t)|/\sin(\omega t) \quad (8)$$

As can be seen, the output voltage is a square wave function, as generally shown in FIG. 5. As before the amplitude of the square wave is a function of the x-component of the incident magnetic field, and is independent of the y-component. The phase of the square wave indicates the direction of the x-component of the magnetic field relative to the applied bias field.

Square wave AC bias field Example

In this example, the bias field is given by the expression $H_b(t)=H_0|\sin(\omega t)|/\sin(\omega t)$, where $|H_0|>>|H|$, where H is the field to be sensed. With a constant voltage excitation, the output of the bridge is given by the expression:

$$V_{out} = V_s \cdot \frac{(R_{1,4} - R_{2,3})}{(R_{1,4} + R_{2,3})} \quad (9)$$

$$R_{1,4}=R_0+C \cdot sqrt\{[H_x+H_0|\sin(\omega t)|/\sin(\omega t)]^2+H_y^2\} \quad (10)$$

$$R_{2,3}=R_0+C \cdot sqrt\{[H_x-H_0|\sin(\omega t)|/\sin(\omega t)]^2+H_y^2\} \quad (11)$$

After inserting the values for $R_{1,4}$ and $R_{2,3}$ from equations (10) and (11) above, this expression yields to linear order in fields:

$$V_{out} = V_s \cdot C \cdot H_x \frac{|Sin(\omega t)|}{Sin(\omega t)} \cdot \frac{1}{(R_0 + C \cdot H_0)} \quad (12)$$

Thus, this embodiment produces a square wave output. The amplitude of the desired component of the incident magnetic field $H_x$ can be determined by examining the amplitude of the square wave, and the polarity of $H_x$ can be determined by examining the phase of the square wave.

With a constant current excitation, the output of the bridge is given by the equation:

$$V_{out}=I_B \cdot (R_{1,4}-R_{2,3})=I_B \cdot C \cdot H_x \cdot |\sin(\omega t)|/\sin(\omega t) \quad (13)$$

This again produces a square wave output. As above, the amplitude and polarity of the desired component of the incident magnetic field $H_x$ can be determined from the amplitude and phase of the output square wave pulse.

Having thus described the preferred embodiments of the present invention, those of skill in the art will readily appreciate that the teachings found herein may be applied to yet other embodiments within the scope of the claims hereto attached.

What is claimed is:

1. A magnetic field sensor for sensing a desired component of an incident magnetic field, comprising:
    two or more magnetoresistive sensor elements;
    bias field generator means for generating a bias field that is parallel to the desired component of the incident magnetic field, wherein the bias field is applied in a first direction relative to a first set of the two or more magnetoresistive sensor elements and in a second direction relative to a second set of the two or more magnetoresistive sensor elements;
    the desired component of the incident magnetic field adding to the bias field incident on the first set of magnetoresistive sensor elements, and subtracting from the bias field incident on the second set of magnetoresistive sensor elements;
    whereby the magnetic field sensor senses the desired component of the incident magnetic field by sensing the difference in resistance caused by the difference in the resulting magnetic fields that are incident on the first set of magnetoresistive sensor elements and the second set of magnetoresistive sensor elements.

2. A magnetic field sensor according to claim 1 wherein the bias field is a DC bias field.

3. A magnetic field sensor according to claim 1 wherein the bias field is an AC bias field.

4. A magnetic field sensor according to claim 1 wherein each of the two or more magnetoresistive sensor elements are elongated in a direction parallel to the bias field.

5. A magnetic field sensor according to claim 4 wherein each of the two or more magnetoresistive sensor elements are substantially identical in size and shape, and thus provide the same resistance when an identical magnetic field is applied thereto.

6. A magnetic field sensor according to claim 1 wherein said bias field generator means comprises an external coil.

7. A magnetic field sensor according to claim 1 wherein said bias field generator means comprises an electromagnet.

8. A magnetic field sensor according to claim 1 wherein the magnetic field sensor is formed on an integrated circuit, and said bias field generator means comprises an integrated on-chip coil.

9. A magnetic field sensor according to claim 1 wherein each of the two or more magnetoresistive sensor elements incorporate a common magnetoresistive material.

10. A magnetic field sensor according to claim 9 wherein the common magnetoresistive material has a symmetrical response curve.

11. A magnetic field sensor according to claim 10 wherein the common magnetoresistive material has an isotropic response curve.

12. A magnetic field sensor according to claim 11 wherein the common magnetoresistive material is a Colossal magnetoresistive material.

13. A magnetic field sensor according to claim 12 wherein the Colossal magnetoresistive material is a material generally described by the formula (LnA)MnO$_3$, wherein Ln is selected from the group consisting of La, Nd, or Pr, and A is selected from the group consisting of Ca, Sr, Ba or Pb.

14. A magnetic field sensor according to claim 13 wherein the Colossal magnetoresistive material is a material generally described by the formula LaCaMnO.

15. A magnetic field sensor according to claim 14 wherein the Colossal magnetoresistive material is LaCaMnO, having concentrations of La between 26–32 at %, Ca between 9–20 at %, and Mn between 47–64 at %.

16. A magnetic field sensor according to claim 15 wherein the concentration of La is 28.4 at %, the concentration of Ca is 11.6 at %, and the concentration of Mn is 60% at %.

17. A magnetic field sensor according to claim 9 wherein the common magnetoresistive material is a giant magnetoresistive material.

18. A magnetic field sensor for producing an output signal that is a function of the amplitude of a desired component of an incident magnetic field, comprising:

bias field generator means for generating a bias field that is parallel to the desired component of the incident magnetic field;

a first leg and a second leg, wherein the first leg connects an output net to a first power supply and the second leg connects the output net to a second power supply, the first and second legs incorporating a magnetoresistive material to produce a change in resistance in the corresponding leg in response to a magnetic field;

said first leg oriented in a first direction relative to the bias field, and the second leg oriented in a second direction relative to the bias field, wherein the first direction is different from the second direction.

19. A magnetic field sensor according to claim 18 wherein said first power supply provides a constant voltage relative to said second power supply.

20. A magnetic field sensor according to claim 18 wherein said first power supply provides a constant current.

21. A magnetic field sensor according to claim 18 wherein the bias field is a DC bias field.

22. A magnetic field sensor according to claim 18 wherein the bias field is an AC bias field.

23. A magnetic field sensor according to claim 18 wherein the first and second legs are elongated in a direction parallel to the bias field.

24. A magnetic field sensor according to claim 18 wherein each of the first and second legs are substantially identical in size and shape, and thus provide the same resistance when an identical magnetic field is applied thereto.

25. A magnetic field sensor according to claim 18 wherein each of the first and second legs incorporate a common magnetoresistive material.

26. A magnetic field sensor according to claim 25 wherein the common magnetoresistive material has a symmetrical response curve.

27. A magnetic field sensor according to claim 26 wherein the common magnetoresistive material has an isotropic response curve.

28. A magnetic field sensor according to claim 27 wherein the common magnetoresistive material is a Colossal magnetoresistive material.

29. A magnetic field sensor according to claim 28 wherein the Colossal magnetoresistive material is a material generally described by the formula (LnA)MnO$_3$, wherein Ln is selected from the group consisting of La, Nd, or Pr, and A is selected from the group consisting of Ca, Sr, Ba or Pb.

30. A magnetic field sensor according to claim 25 wherein the common magnetoresistive material is a giant magnetoresistive material.

31. A magnetic field sensor for producing an output voltage that is a function of the amplitude of a desired component of an incident magnetic field, comprising:

bias field generator means for generating a bias field that is parallel to the desired component of the incident magnetic field;

a first, a second, a third and a fourth leg, wherein the first and second legs connect a first output net and a second output net, respectively, to a first power supply, and the third and fourth legs connect the first output net and the second output net, respectively, to a second power supply, selected ones of the first, second, third and fourth legs incorporating a magnetoresistive material to produce a change in the resistance in the corresponding leg in response to a magnetic field;

said first leg and said fourth leg being oriented in a first direction relative to the bias field, and the second and third legs being oriented in a second direction relative to the bias field, wherein the first direction is different from the second direction.

32. A magnetic field sensor for sensing a desired component of an incident magnetic field, the magnetic field sensor comprising:

bias field generator means for generating a bias field that is parallel to the desired component of the incident magnetic field;

an elongated first leg having a first end and a second end and extending generally parallel to the bias field, the first leg oriented such that the bias field is applied from the first end to the second end thereof, the first end of the first leg connected to a first power supply terminal, and at least a portion of the first leg being formed from a magnetoresistive material;

an elongated second leg having a first end and a second end and extending generally parallel to the bias field, the second leg oriented such that the bias field is applied from the first end to the second end thereof, the first end of the second leg connected to the second end of the first leg, and the second end of the second leg connected to a second power supply terminal, at least a portion of the second leg being formed from a magnetoresistive material;

an elongated third leg having a first end and a second end and extending generally parallel to the bias field, the third leg oriented such that the bias field is applied from the first end to the second end thereof, the first end of the third leg is connected to a third power supply terminal, and at least a portion of the third leg being formed from a magnetoresistive material;

an elongated fourth leg having a first end and a second end and extending generally parallel to the bias field, the fourth leg oriented such that the bias field is applied from the first end to the second end thereof, the first end of the fourth leg connected to the second end of the third leg, and the second end of the fourth leg connected to the fourth power supply terminal, at least a portion of the fourth leg being formed from a magnetoresistive material;

whereby an output voltage is produced between the second end of the first leg and the first end of the fourth leg that is a function of the amplitude of the desired component of the incident magnetic field.

33. A magnetic field sensor according to claim 32 wherein the first power supply terminal is electrically connected to the second power supply voltage terminal, and the third power supply terminal is electrically connected to the fourth power supply terminal.

34. A magnetic field sensor according to claim 32 wherein the bias field is a DC bias field.

35. A magnetic field sensor according to claim 32 wherein the bias field is an AC bias field.

36. A magnetic field sensor according to claim 35 wherein the AC bias field is a sine wave bias field.

37. A magnetic field sensor according to claim 35 wherein the AC bias field is a square wave bias field.

38. A magnetic field sensor according to claim 32 wherein each of the first, second, third and fourth legs incorporate a common magnetoresistive material.

39. A magnetic field sensor according to claim 38 wherein each of the first, second, third and fourth legs are substantially identical in size and shape, and thus provide the same resistance when an identical magnetic field is applied thereto.

40. A magnetic field sensor according to claim 39 wherein the common magnetoresistive material has a symmetrical response curve.

41. A magnetic field sensor according to claim 40 wherein the common magnetoresistive material has an isotropic response curve.

42. A magnetic field sensor according to claim 41 wherein the common magnetoresistive material is a Colossal magnetoresistive material.

43. A magnetic field sensor according to claim 42 wherein the Colossal magnetoresistive material is a material generally described by the formula $(LnA)MnO_3$, wherein Ln is selected from the group consisting of La, Nd, or Pr, and A is selected from the group consisting of Ca, Sr, Ba or Pb.

44. A magnetic field sensor according to claim 43 wherein the Colossal magnetoresistive material is a material generally described by the formula LaCaMnO.

45. A magnetic field sensor according to claim 38 wherein the common magnetoresistive material is a giant magnetoresistive material.

46. A method for sensing a desired component of an incident magnetic field using a magnetic field sensor having two or more magnetoresistive sensor elements, the method comprising the steps of:

providing a bias field that is parallel to the desired component of the incident magnetic field, wherein the bias field is applied in a first direction relative to a first set of the two or more magnetoresistive sensor elements and in a second direction relative to a second set of the two or more magnetoresistive sensor elements;

receiving the incident magnetic field, wherein the desired component of the incident magnetic field adds to the bias field incident on the first set of magnetoresistive sensor elements, and subtracts from the bias field incident on the second set of magnetoresistive sensor elements;

whereby the magnetic field sensor senses the desired component of the incident magnetic field by sensing a difference in resistance caused by the difference in the magnetic fields that are incident on the first set of magnetoresistive sensor elements and the second set of magnetoresistive sensor elements.

* * * * *